United States Patent
Gosain et al.

[11] Patent Number: 6,093,586
[45] Date of Patent: Jul. 25, 2000

[54] METHOD OF MANUFACTURING A SEMICONDUCTOR DEVICE AND A PROCESS OF MANUFACTURING A THIN FILM TRANSISTOR

[75] Inventors: Dharam Pal Gosain; Jonathan Westwater; Miyako Nakagoe; Setsuo Usui, all of Kanagawa, Japan

[73] Assignee: Sony Corporation, Tokyo, Japan

[21] Appl. No.: 08/902,069

[22] Filed: Jul. 29, 1997

[30] Foreign Application Priority Data

Jul. 31, 1996 [JP] Japan ............................... P08-217754

[51] Int. Cl.⁷ .................................................. H01L 21/84
[52] U.S. Cl. ........................ 438/162; 438/151; 438/166; 148/DIG. 100
[58] Field of Search .................................... 438/151, 166, 438/162, FOR 155, FOR 183, FOR 184, FOR 200, FOR 201, FOR 455; 148/DIG. 100; 257/51, 66

[56] References Cited

U.S. PATENT DOCUMENTS

| | | | |
|---|---|---|---|
| 4,788,157 | 11/1988 | Nakamura et al. | 437/46 |
| 5,126,701 | 6/1992 | Adlerstein | 333/172 |
| 5,130,263 | 7/1992 | Possin et al. | 437/40 |
| 5,391,507 | 2/1995 | Kwasnick et al. | 437/40 |
| 5,541,128 | 7/1996 | Kwasnick et al. | 437/41 |
| 5,637,519 | 6/1997 | Tsai et al. | 438/160 |
| 5,648,662 | 7/1997 | Zhang et al. | 257/59 |
| 5,804,473 | 9/1998 | Takizawa | 438/166 |
| 5,821,137 | 10/1998 | Wakai et al. | 438/166 |

FOREIGN PATENT DOCUMENTS

| | | | |
|---|---|---|---|
| 0 766 296 A2 | 4/1997 | European Pat. Off. | |
| 405335333 | 12/1993 | Japan | 438/FOR 183 |
| 406045354 | 2/1994 | Japan | |

OTHER PUBLICATIONS

Journal of Applied Physics, "Grain growth in laser dehydrogenated and crystallized polycrystalline silicon for thin film transistors", vol. 76, No. 5, P. Mei et al., pp. 3194–3199, Sep. 1, 1994.

Japanese Journal of Applied Physics, "High Mobility Botton–Gate Thin–Film Transistors with Laser–Crystallized and Hydrogen Radical Annealed Polysilicon Films", Shimizu et al., pp. 626–628, Aug. 27–29, 1991.

*Primary Examiner*—Long Pham
*Attorney, Agent, or Firm*—Hill & Simpson

[57] ABSTRACT

To enable radiating an optimum energy beam depending upon the structure of a substrate (whether a metallic film is formed or not) when an amorphous semiconductor film is crystallized and uniformly crystallizing the overall film, first, a photoresist film and the area of an N⁺ doped amorphous silicon film on the photoresist film are selectively removed by a lift-off method. Hereby, the amorphous silicon film is thicker in an area except an area over a metallic film (a gate electrode) than in the area over the metallic film. In this state, a laser beam is radiated. The N⁺ doped amorphous silicon film and an amorphous silicon film are melted by radiating a laser beam and afterward, melted areas are crystallized by cooling them to room temperature. As the amorphous silicon film is thicker in the area except the area under which the metallic film (the gate electrode) is formed than in the area under which the metallic film is formed, the maximum temperature of the surface of the film is equal and the overall film can be uniformly crystallized.

12 Claims, 9 Drawing Sheets

F I G. 5

| MATERIAL | HEAT CONDUCTION (W/cm·K) | SPECIFIC HEAT (J/g·K) | DENSITY (g/cm³) |
|---|---|---|---|
| a-Si | $1.3 \times 10^{-11}(T-900)^3 +$ $1.3 \times 10^{-9}(T-900)^2 +$ $1.0 \times 10^{-5}(T-900) +$ $1.0 \times 10^{-2}$ | $0.952 + 2.496 \times 10^{-4} T$ | 2.33 |
| SiO₂ | $0.0115 + 1.343$ $\times 10^{-5}(T-300)$ | 1.0 (DEPENDENCE UPON TEMPERATURE NOT CONSIDERED) | 2.27 |
| SiN | 0.1 (DEPENDENCE UPON TEMPERATURE NOT CONSIDERED) | 0.74 (DEPENDENCE UPON TEMPERATURE NOT CONSIDERED) | 3.2 |
| Ni | 0.7 (DEPENDENCE UPON TEMPERATURE NOT CONSIDERED) | 0.44 (DEPENDENCE UPON TEMPERATURE NOT CONSIDERED) | 8.90 |

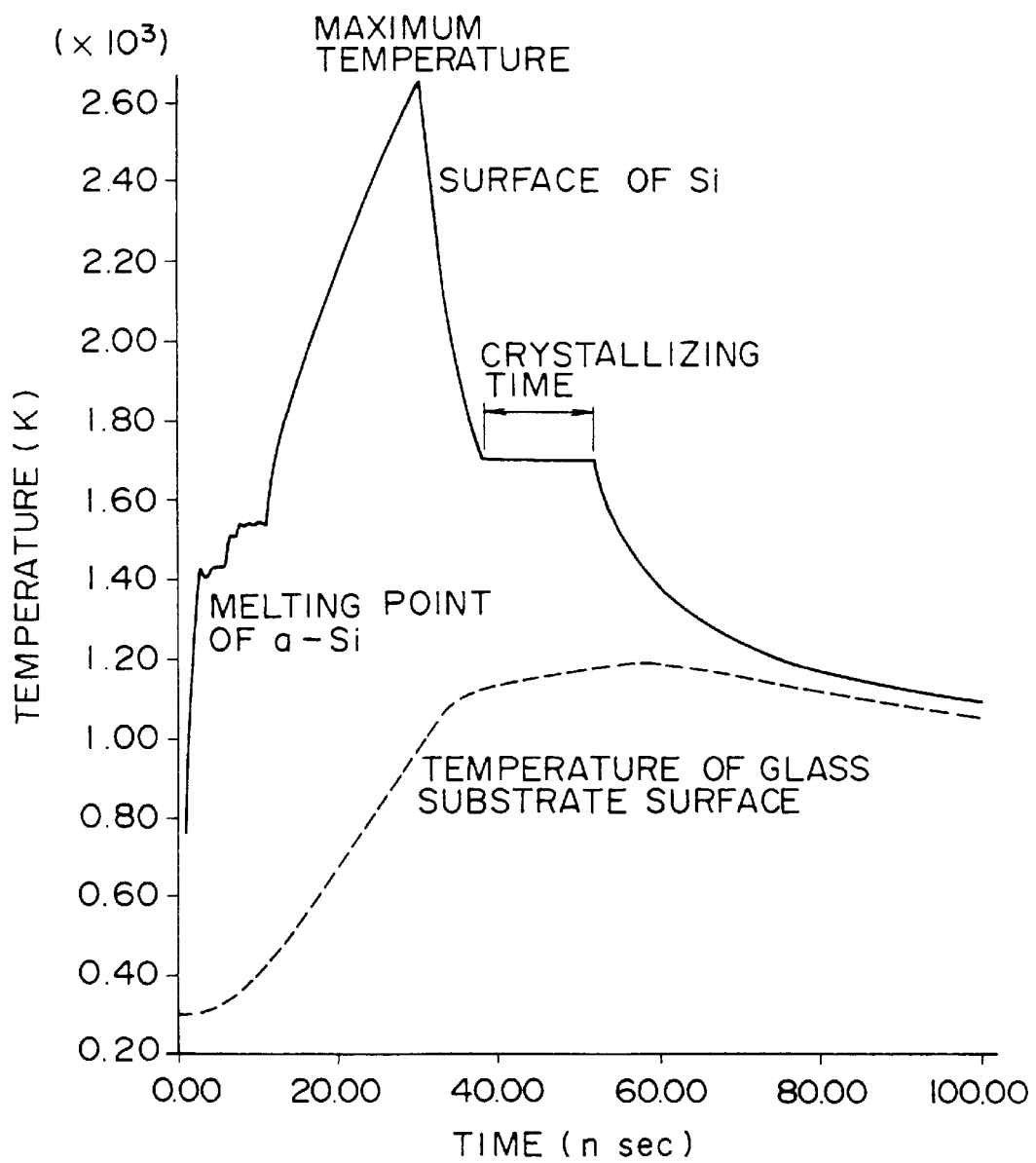

METHOD OF MANUFACTURING A SEMICONDUCTOR DEVICE AND A PROCESS OF MANUFACTURING A THIN FILM TRANSISTOR

BACKGROUND OF THE INVENTION

1. Field of the Invention

The present invention relates to a method of manufacturing a semiconductor device in which a film is formed by crystallizing a semiconductor film by radiating an energy beam on the semiconductor film such as amorphous silicon, particularly relates to a method of manufacturing a semiconductor device provided with structure in which the substrate material of a semiconductor film to be crystallized is not even such as a thin film transistor (TFT) used for a liquid crystal display (LCD) and others.

2. Description of the Related Art

A TFT liquid crystal display uses a thin film transistor (TFT) for a pixel provided with a switching function and this TFT is formed on a glass substrate corresponding to each pixel of the liquid crystal display. There are two types of TFTs of TFT consisting of amorphous silicon films and TFT consisting of polycrystalline silicon films, and high-performance TFT consisting of polycrystalline silicon films of these can be produced on a glass substrate at low temperature by irradiating an amorphous silicon film with an energy beam, particularly an excimer laser beam. The peripheral circuit of a liquid crystal display and a pixel switching device can be produced on the same substrate by using such TFT consisting of polycrystalline silicon films. Recently, TFT provided with bottom gate structure attracts attention of TFTs consisting of polycrystalline silicon films because particularly, stable characteristics can be obtained.

This TFT provided with bottom gate structure is constituted as shown in FIG. 9 for example. That is, a gate electrode 101 consisting of molybdenum tantalum (MoTa) is formed on a glass substrate 100 and an oxide film ($Ta_2O_5$) 102 is formed on this gate electrode 101. A gate insulating film consisting of a silicon nitride ($SiN_x$) film 103 and a silicon dioxide ($SiO_2$) film 104 is formed on the glass substrate 100 including this oxide film 102 and further, a thin polycrystalline silicon film 105 is formed on this silicon dioxide film 104. A source area 105a and a drain area 105b are respectively formed by doping N-type impurities for example in this polycrystalline silicon film 105. A silicon dioxide film ($SiO_2$) 106 is selectively formed corresponding to the channel area 105c of this polycrystalline silicon film 105 on the polycrystalline silicon film 105. An $N^+$ doped polycrystalline silicon film 107 is formed on the polycrystalline silicon film 105 and the silicon dioxide film 106 and further, a source electrode 108 and a drain electrode 109 are respectively formed opposite to the source area 105a and the drain area 105b on this $N^+$ doped polycrystalline silicon film 107.

This TFT provided with bottom gate structure can be manufactured by the following method: That is, after a molybdenum tantalum (MoTa) film is formed on an overall glass substrate 100, a gate electrode 101 is formed by patterning this molybdenum tantalum film by etching so that the film is in a predetermined shape. Afterward, an oxide film 102 is formed on the surface of the gate electrode 101 by anodizing the gate electrode 101. Next, a silicon nitride film 103, a silicon dioxide film 104 and an amorphous silicon film are sequentially formed on the overall oxide film 102 by plasma enhanced chemical vapor deposition (PECVD).

Next, this amorphous silicon film is once fused by irradiating this amorphous silicon film with a laser beam by an excimer laser for example and afterward, crystallized by cooling the film to room temperature. Hereby, the amorphous silicon film is changed to a polycrystalline silicon film 105. Next, after a silicon dioxide film 106 in the shape corresponding to a channel area is selectively formed on the polycrystalline silicon film 105 of a part to be a channel area, an amorphous silicon film including N-type impurities, for example phosphorus (P) and arsenic (As) is formed and changed to an $N^+$ doped polycrystalline silicon film 107 by irradiating the above amorphous silicon film with a laser beam by an excimer laser again, and the impurities are electrically activated.

Next, after an aluminum (Al) film is formed on the overall film by a sputtering method using argon (Ar) as sputtering gas, this aluminum film and the $N^+$ doped polycrystalline silicon film 107 are respectively patterned by etching so that they are in a predetermined shape, and a source electrode 108 and a drain electrode 109 are respectively formed on a source area 105a and a drain area 105b. Next, dangling bond and others are inactivated by exposing the above silicon dioxide film to hydrogen and hydrogenating a channel area 105c by a hydrogen radical and atomic hydrogen which both pass through the silicon dioxide film 106. TFT provided with bottom gate structure shown in FIG. 9 can be obtained by the above process.

OBJECT AND SUMMARY OF THE INVENTION

As described above, in the prior method, an energy beam is radiated onto an amorphous silicon film in a process for crystallizing it, however, at this time, the structure of a substrate under the amorphous silicon film is not even. That is, a metallic film (the gate electrode 101) is applied on the glass substrate 100, the substrate under the amorphous silicon film consists of metal and glass which are different in material and heretofore, an energy beam is simultaneously radiated onto an amorphous silicon film over the respective substrate and film. In this case, the same energy beam as the following energy is also radiated onto an amorphous silicon film over the glass substrate 100 based upon the optimum condition of the crystallizing energy of the amorphous silicon film in a channel area over the metallic film (the gate electrode 101).

However, even if the same amorphous silicon film is used, the optimum value of energy required for crystallization is different depending upon whether a substrate is made of metal or glass because thermal conductivity is different. Therefore, more energy beam is radiated onto the amorphous silicon film on the glass substrate 100 by the prior method according to the optimum condition of the amorphous silicon film on the metallic film (the gate electrode 101) than the optimum condition and therefore, there is a problem that partially a film is broken.

The present invention is made to solve such problems and the object is to provide a method of manufacturing a semiconductor device in which an optimum quantity of energy beams can be radiated depending upon the structure of a substrate when an amorphous semiconductor film is crystallized, an overall film can be uniformly crystallized and a film is never broken.

A method of manufacturing a semiconductor device according to the present invention comprises a process for selectively forming a metallic film on a substrate, a process for forming an amorphous semiconductor film on the substrate and the metallic film so that an area on the substrate is thicker than an area on the metallic film and a process for uniformly polycrystallizing the semiconductor film by radiating an energy beam onto the semiconductor film.

More concretely, a method of manufacturing a semiconductor device according to the present invention comprises a process for forming a metallic film as the gate electrode of a thin film transistor on the surface of a substrate and forming an insulating film on this metallic film and the substrate, a process for forming a first amorphous semiconductor film the thickness of which is uniform on the insulating film, a process for selectively forming a lift-off film in an area on the first semiconductor film corresponding to the metallic film, a process for forming a second amorphous semiconductor film the thickness of which is uniform including impurities on the lift-off film and the first semiconductor film and a process for polycrystallizing the first and second semiconductor films by radiating an energy beam after the lift-off film and an area on the lift-off film of the second semiconductor film are selectively removed and respectively forming the source area and the drain area of the thin film transistor.

A method of manufacturing a semiconductor device according to the present invention may be also constituted so that it comprises a process for forming a metallic film as the gate electrode of a thin film transistor on the surface of a substrate and forming an insulating film on this metallic film and the substrate, a process for selectively forming a lift-off film in an area on the insulating film corresponding to the metallic film, a process for forming a first amorphous semiconductor film the thickness of which is uniform including impurities on the lift-off film and the insulating film, a process for forming a second amorphous semiconductor film the thickness of which is uniform on the insulating film and the first semiconductor film after the lift-off film and an area on the lift-off film of the first semiconductor film are selectively removed and a process for polycrystallizing the first and second semiconductor films by radiating an energy beam after the second semiconductor film is formed and respectively forming the source area and the drain area of the thin film transistor.

According to a method of manufacturing a semiconductor device according to the present invention, as the thickness of a semiconductor film is different depending upon the state of a substrate (whether a metallic film is formed or not) when an energy beam is radiated to crystallize an amorphous semiconductor film, the overall semiconductor film can be uniformly crystallized by radiating beams with the same energy.

BRIEF DESCRIPTION OF THE DRAWINGS

FIG. 4A is a sectional view showing structure in which a metallic film is formed under a silicon film and FIG. 4B is a sectional view showing structure in which a metallic film is not formed under a silicon film;

FIG. 5 shows parameters of each material used for simulation for explaining the principle shown in FIGS. 4;

FIG. 6 is a drawing showing a characteristic for explaining the change of the temperature of a silicon film when a laser beam is radiated on the structure shown in FIG. 4A;

DESCRIPTION OF THE PREFERRED EMBODIMENTS

Referring to drawings, embodiments according to the present invention will be described in detail below.

Prior to the concrete description of the embodiments, first, the basic principle of the present invention will be described. As described above, even if the same amorphous silicon film is used, the optimum value of energy required for crystallization is different depending upon whether a substrate is made by metal or glass. According to the present invention, an overall semiconductor film can be uniformly crystallized by radiating beams with the same energy by changing the thickness of the amorphous silicon film depending upon the structure of a substrate (whether a metallic film is formed or not). The reasons will be described below.

Figure 4A:
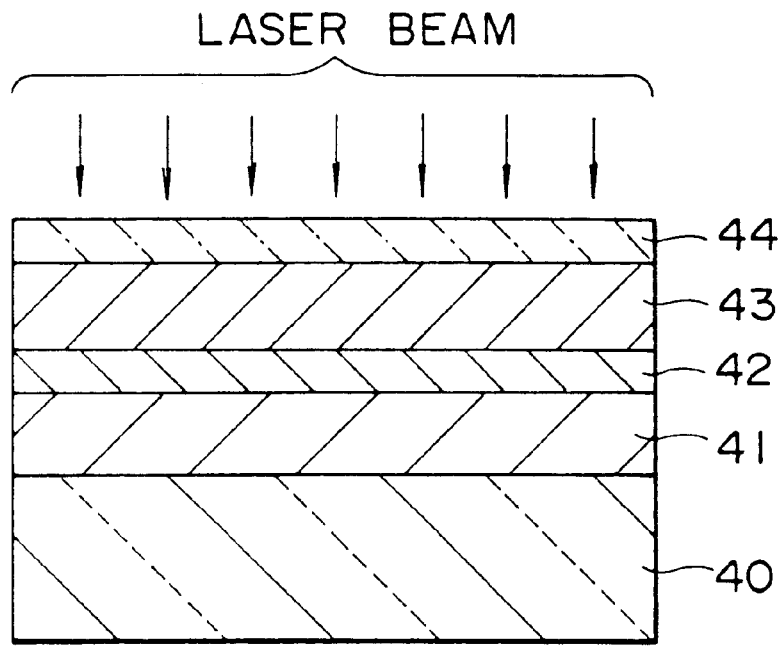
FIGS. 4A and 4B explain the basic principle of the present invention.
Figure 4B:
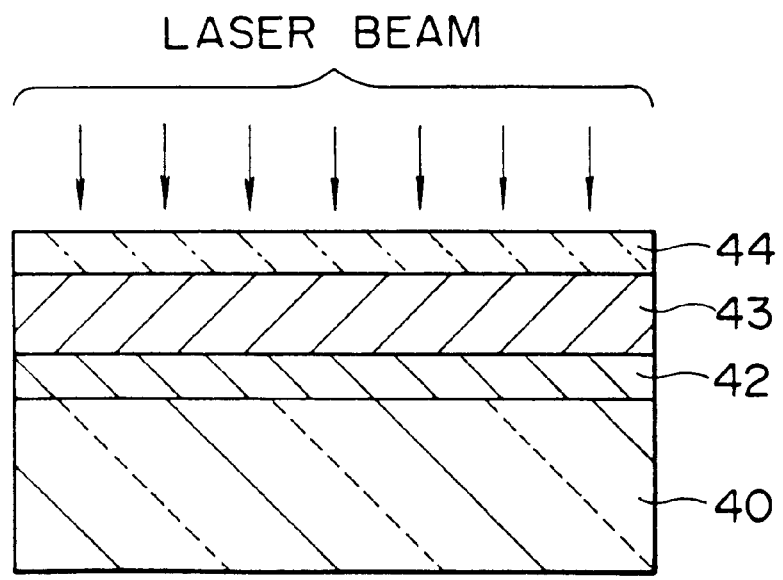

FIGS. 4A and 4B show examples of substrates which are different in the substrate structure of a silicon film. The structure shown in FIG. 4A is formed by sequentially forming a nickel (Ni) film 41 on a glass substrate 40, a silicon nitride (SiN) film 42, an insulating film ($SiO_2$) 43 and an amorphous silicon film (a-Si) 44 on the nickel film. In the meantime, the structure shown in FIG. 4B is formed by sequentially forming a silicon nitride (SiN) film 42 on a glass substrate 40, an insulating film ($SiO_2$) 43 and an amorphous silicon film 44 and is the same as the structure shown in FIG. 4A except that a metallic film (the nickel film 41) is not formed under the amorphous silicon film 44.

Figure 7:
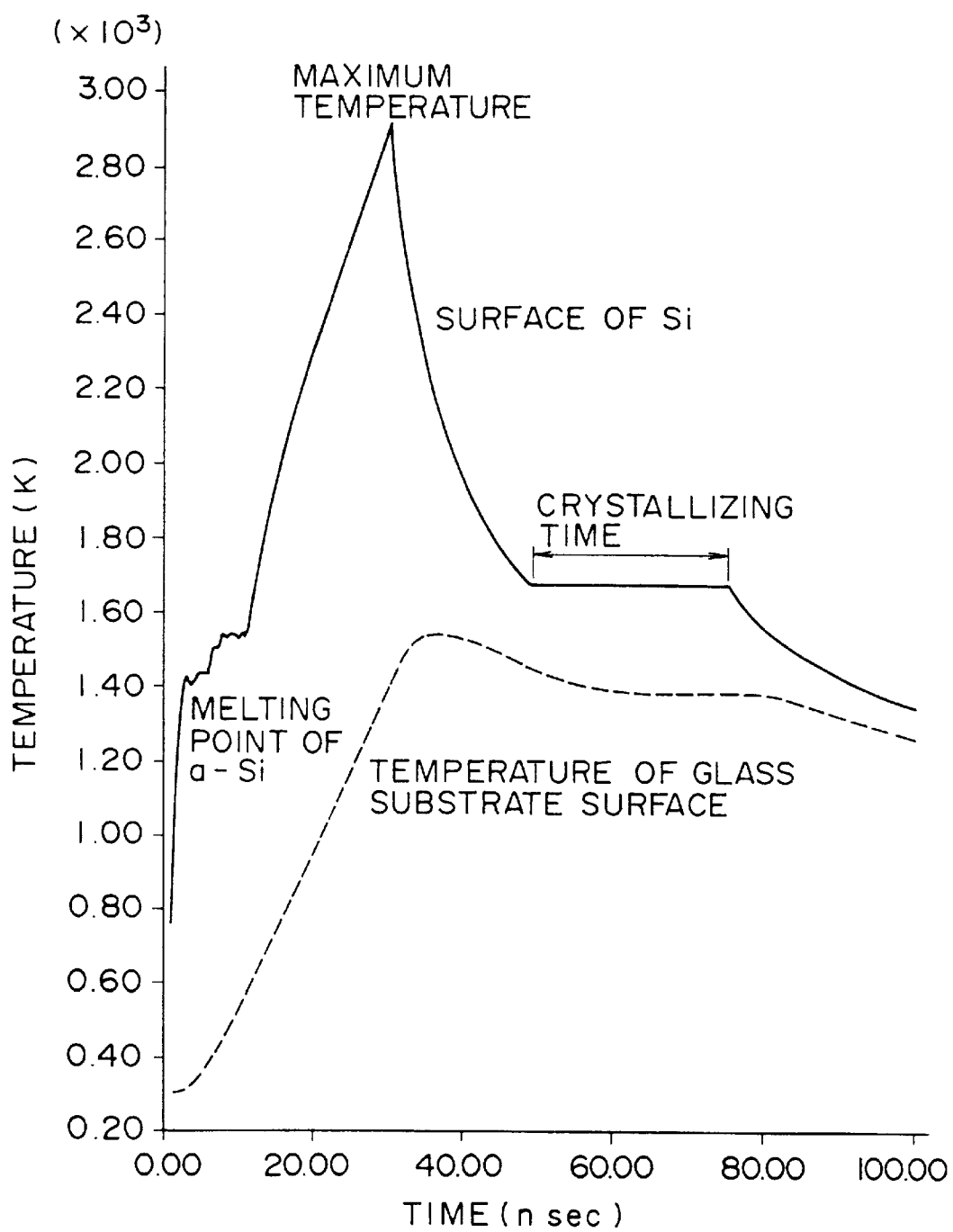
FIG. 7 is a drawing showing a characteristic for explaining the change of the temperature of a silicon film when a laser beam is radiated on the structure shown in FIG. 4B.

FIG. 6 shows the result of simulating the change of the temperature of the surface of the amorphous silicon film 44 when an excimer laser beam (energy: 360 $mJ/cm^2$, pulse length: 30 ns, wavelength: 308 nm) is radiated onto the amorphous silicon film 44 in the structure shown in FIG. 4A as an energy beam. In the meantime, FIG. 7 shows the result of simulating the change of the temperature of the surface of the amorphous silicon film 44 when the same excimer laser beam is radiated onto the amorphous silicon film 44 in the structure shown in FIG. 4B. FIG. 5 shows the parameters of the material of each film.

As clear from the result of FIGS. 6 and 7, while an excimer laser beam is radiated, the temperature of the amorphous silicon film 44 rapidly rises to a melting point (the melting point of a-Si) and when the temperature reaches the melting point, the incline of rising is once gentle because of the latent heat of melting and afterward, the temperature rapidly rises again. Even if excimer laser beams with the same energy are radiated, the maximum temperature is different depending upon the substrate structure of the amorphous silicon film 44. That is, if a metallic film (the nickel film 41) is formed below the amorphous silicon film 44 as shown in FIG. 4A, the maximum temperature is approximately 2650 (K), while if a metallic film (the nickel film 41) is not formed below the amorphous silicon film as shown in FIG. 4B, the maximum temperature is approximately 2940 (K) and is greatly different depending upon the structure of a substrate. The difference between the maximum temperatures is increased as the insulating film 43 is thinned. When the radiation of an excimer laser beam is finished after the temperature reaches the maximum temperature, heat is transmitted in the direction of the glass substrate 40 and the temperature of the amorphous silicon film 44 gradually falls in both structures shown in FIGS. 4A and B. When the temperature reaches temperature required for crystallizing silicon (1410° C.), latent heat is generated by crystallization, the temperature is held fixed for some time (crystallizing time) and afterward, gradually falls again.

If an excimer laser beam is radiated onto the amorphous silicon film 44 in the respective structures shown in FIGS. 4A and B, it is desirable so as to optimize a laser beam condition that the maximum temperature which can be achieved by the same energy of the surface of each amorphous silicon film 44 is the same. The inventors of the present invention consider that if a silicon film on a metallic film (the nickel film 41) is thickened in the structure shown in FIG. 4B, the same temperature condition as in the structure shown in FIG. 4A can be set and therefore, the temperature of the surface of the silicon film can be equal independent of the structure of a substrate (whether a metallic film is formed or not), and obtain a drawing showing a characteristic in FIG. 8 in experiments.

Figure 8:
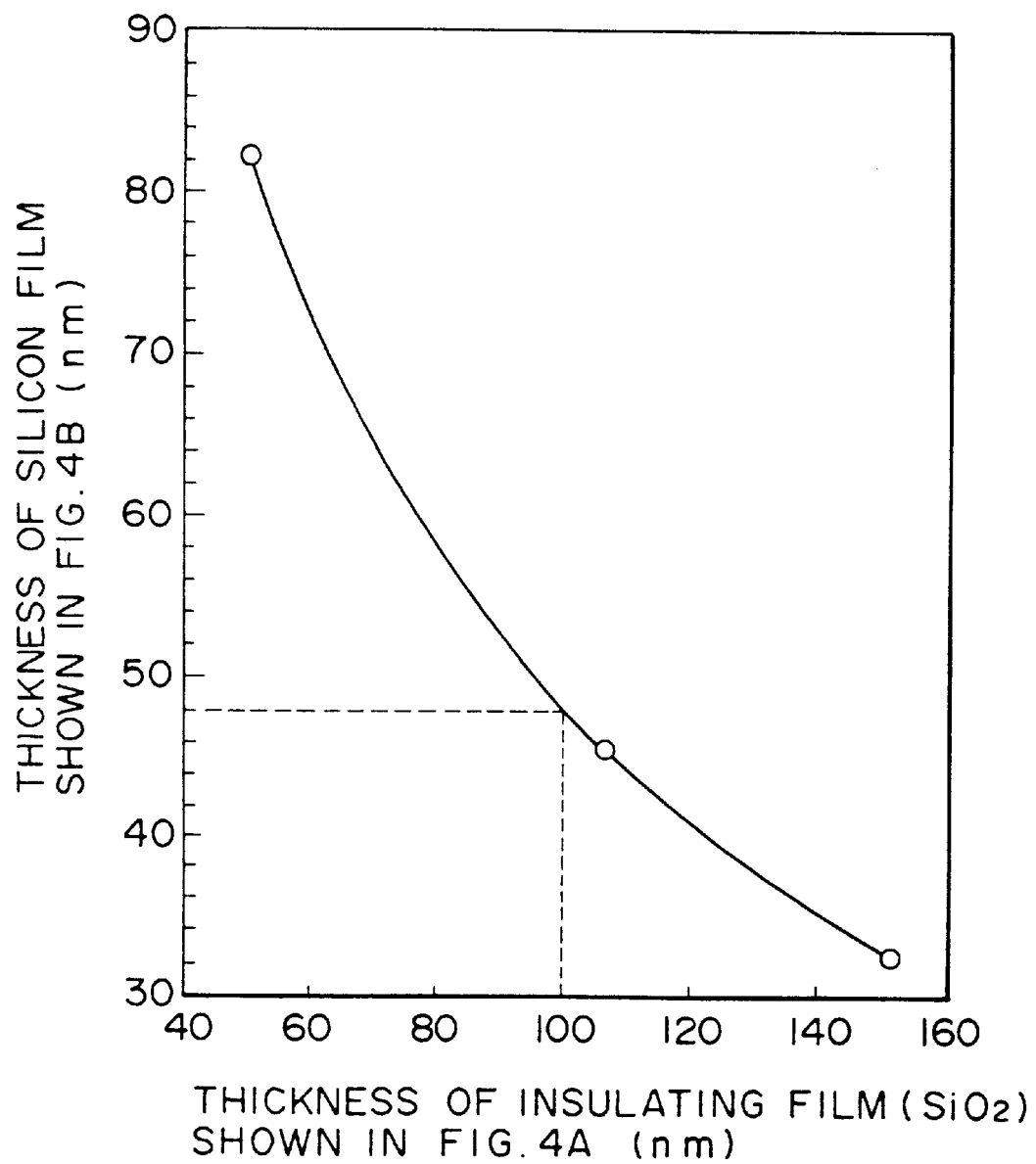
FIG. 8 is a drawing showing a characteristic showing the thickness of a silicon film in the structure shown in FIG. 4B to the thickness (30 nm) of an insulating film shown in FIG. 4A for obtaining the maximum temperature of 2650 K in both structures shown in FIGS. 4A and 4B.
Figure 9:
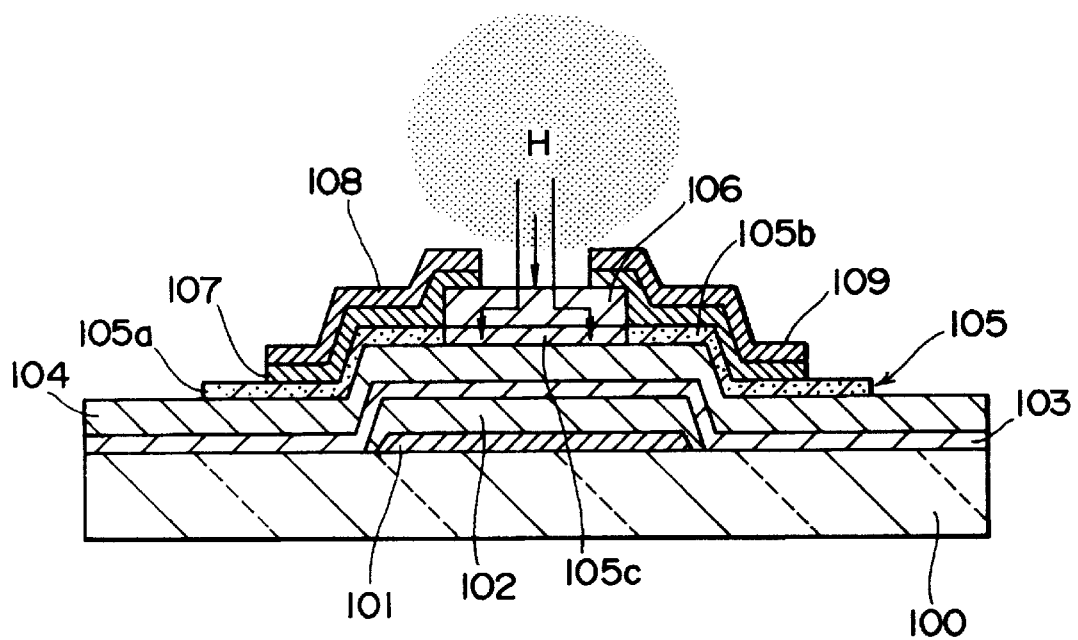
FIG. 9 is a sectional view for explaining the prior structure of a thin film transistor and the manufacturing method.

FIG. 8 shows the thickness of the silicon film 44 in the structure shown in FIG. 4B to that of the silicon film 44 which is 30 nm shown in FIG. 4A for obtaining the maximum temperature of 2650 K in both structures shown in FIGS. 4 A and B. That is, FIG. 8 shows the result of simulating the thickness of the silicon film 44 in the structure shown in FIG. 4B in case that in the structure shown in FIG. 4A, the thickness of the silicon film 44 on the nickel (Ni) film 41 is set to 30 nm, the thickness of the nickel film 41 is set to 100 nm, the thickness of the silicon nitride (SiN) film 42 is set to 50 nm and the thickness of an insulating film ($SiO_2$) 43 is changed so that the temperature of the surface of the silicon film in the structures shown in FIG. 4A and B reaches 2650 K (the boiling point of silicon). This result shows that when the thickness of the insulating film 43 in the structure shown in FIG. 4A is reduced, the silicon film is required to be thickened in the structure shown in FIG. 4B to obtain the same maximum temperature. That is, the result shows that the thickness of the silicon film in the structure shown in FIG. 4B has only to be set according to the result shown in FIG. 8 so that the maximum temperature of the surface of the silicon film 44 obtained by radiating an energy beam in the structures shown in FIG. 4 A and B can be equal so as to optimize a laser beam condition.

The present invention utilizes such a result for uniformly crystallizing an overall film at the same maximum temperature by changing the thickness of a silicon film depending upon the structure of a substrate (whether a metallic film is formed or not) on the same substrate. An example in which the present invention is applied to a method of manufacturing a thin film transistor will be described below.

First Embodiment

Figure 1A:
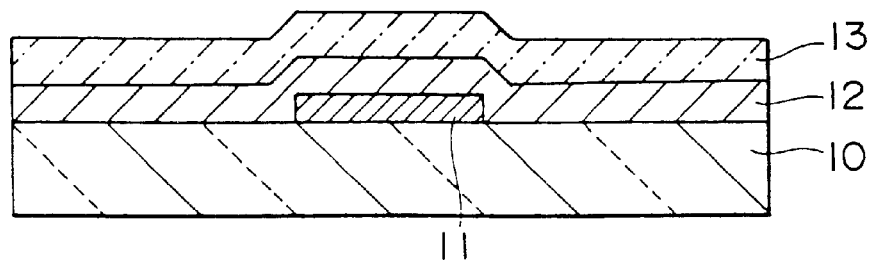
FIGS. 1A to C are sectional views showing a method of manufacturing a thin film transistor equivalent to a first embodiment according to the present invention every process.

FIGS. 1A to C and FIGS. 2A and B show a method of manufacturing a thin film transistor equivalent to a first embodiment of the present invention in the order of processes. First, as shown in FIG. 1A, a gate electrode 11 consisting of a nickel (Ni) film the thickness of which is 100 nm is formed on the overall surface of a substrate, for example a glass substrate 10 by sputtering using argon (Ar) as sputtering gas. Next, a laminated insulting film 12 is formed by sequentially forming a silicon nitride ($SiN_x$) layer which is 50 nm thick and a silicon dioxide ($SiO_2$) layer which is 100 nm thick on the overall surface similarly by sputtering using helium (He) as sputtering gas, and next, an amorphous silicon film 13 which is 30 nm thick is formed on the insulating film 12 by PECVD for example.

Figure 1B:
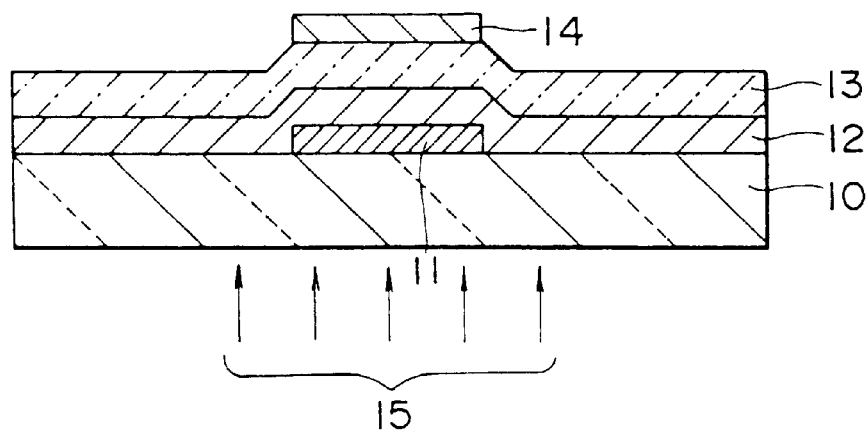
Figure 1C:
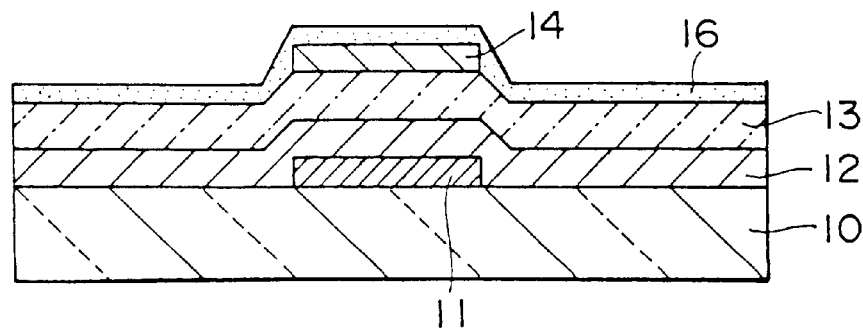

After the amorphous silicon film 13 is formed, a photoresist is applied onto this amorphous silicon film 13 and exposure (back exposure) 15 to this photoresist by gamma rays (wavelength: 436 nm) for example is executed from the rear side of the glass substrate 10. At this time, a photoresist film 14 with the same width as the gate electrode 12 as shown in FIG. 1B is formed by self-matching with the gate electrode 12 functioning as a mask. Next, as shown in FIG. 1C, an $N^+$ doped amorphous silicon film 16 including N-type impurities, for example phosphorus (P) is formed on the insulating film 12 and the photoresist film 14 by PECVD for example. The temperature of the substrate at this time shall be the heat-resistant temperature (for example, 150° C.) of the photoresist film 14 or less. The thickness of the $N^+$ doped amorphous silicon film 16 is determined according to the result shown in FIG. 8 based upon the thickness of the $SiO_2$ layer of the insulating film 12. As the thickness of the $SiO_2$ layer of the insulating film 12 is set to 100 nm in this embodiment, the required thickness of the amorphous silicon film in an area except the gate electrode 11 is 48 nm as shown in FIG. 8. Therefore, the thickness of the $N^+$ doped amorphous silicon film 16 is set to 18 nm obtained by subtracting 30 nm (the thickness of the amorphous silicon film 13) from 48 nm.

Figure 2A:
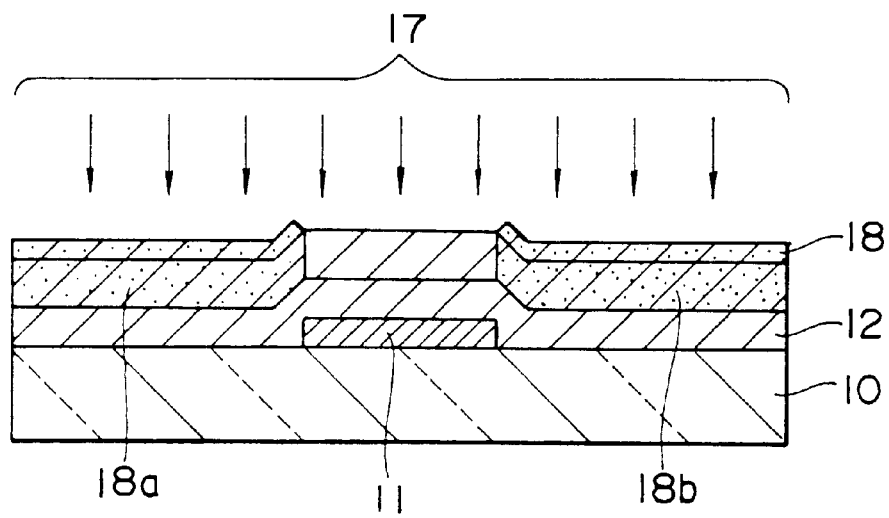
FIGS. 2A and 2B are sectional views showing a process next to FIG. 1.

Afterward, as shown in FIG. 2A, the photoresist film 14 and the area of the $N^+$ doped amorphous silicon film 16 on the photoresist film 14 (that is, an area corresponding to a channel area) are selectively removed by a lift-off method. Hereby, the amorphous silicon film is thicker in an area except an area over metal (the gate electrode 11) than in the area over the metal. In this state, next, a laser beam 17 is radiated from the surface of the substrate. The $N^+$ doped amorphous silicon film 16 and the amorphous silicon film 13 are melted by radiating a laser beam 17 as described above and afterward, melted areas are crystallized by cooling them to room temperature. At this time, the N-type impurities in the $N^+$ doped amorphous silicon film 16 are diffused on the side of the amorphous silicon film 13 and an $N^+$ doped polycrystalline silicon film 18 provided with a source area 18a and a drain area 18b is formed. As in this embodiment, the amorphous silicon film is thicker in the area except the area over the metallic film (the thickness of the amorphous silicon film: 48 nm) than in the area over the metallic film (the gate electrode 11) (thickness: 30 nm), the maximum temperature of the surface of the film is substantially equal as described above and the overall film can be uniformly crystallized.

It is desirable for a laser beam 17 that a laser beam the wavelength of which the $N^+$ doped amorphous silicon film 18 can absorb, particularly a pulse laser beam by an excimer laser is used. In detail, a pulse laser beam (wavelength: 308 nm) by XeCl excimer laser, a pulse laser beam (wavelength: 350 nm) by XeF excimer laser and others are used.

Figure 2B:
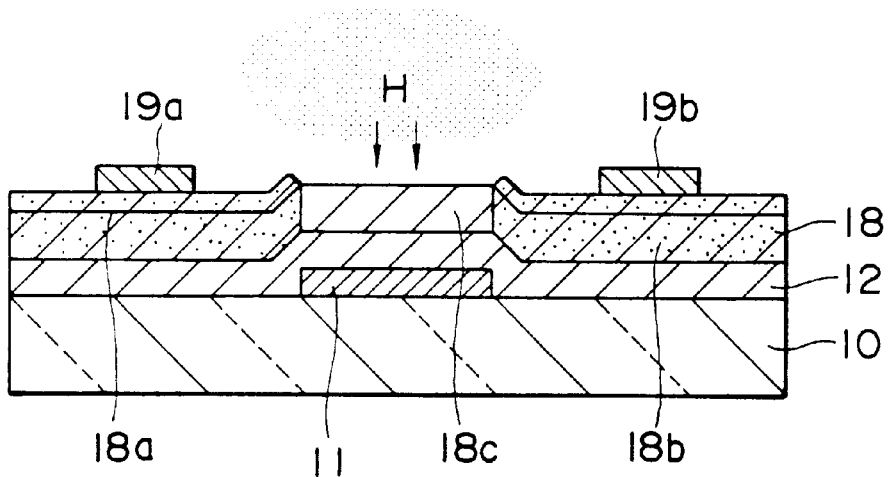

Next, as shown in FIG. 2B, electrodes 19a and 19b consisting of aluminum (Al) are respectively formed on the source area 18a and the drain area 18b in the $N^+$ doped polycrystalline silicon film 18 by sputtering using argon (Ar) as sputtering gas. Next, the channel area 18c in the $N^+$ doped polycrystalline silicon film 18 is hydrogenated in hydrogen plasma to inactivate dangling bond and others.

As described above, according to the method of manufacturing a thin film transistor equivalent to this embodiment, as the thickness of a silicon film is set to a different value depending upon the structure of a substrate (whether a metallic film is formed or not) when a laser beam 17 is radiated for crystallization, the silicon film can be uniformly crystallized over the overall substrate. Therefore, a film is never broken and a process margin can be increased.

Second Embodiment

FIGS. 3A to 3D show a method of manufacturing a thin film transistor equivalent to a second embodiment of the present invention in the order of processes. In this embodiment, the order in the first embodiment of forming an amorphous silicon film and a doped amorphous silicon film is inverted.

Figure 3A:
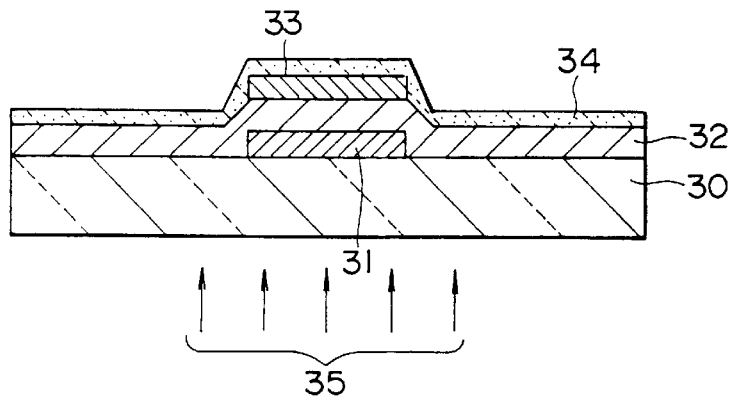
FIGS. 3A to 3D are sectional views showing a method of manufacturing a thin film transistor equivalent to a second embodiment according to the present invention every process.

That is, first as shown in FIG. 3A, a gate electrode 31 consisting of a nickel (Ni) film which is 100 nm thick is formed on the overall surface of a substrate, for example a glass substrate 30 by sputtering using argon (Ar) as sputtering gas. Next, a laminated insulating film 32 which is 100 nm thick is formed by sequentially forming a silicon nitride (SiN$_x$) film and a silicon dioxide (SiO$_2$) film on the overall substrate similarly by sputtering using helium (He) as sputtering gas and next, a photoresist is applied onto this insulating film 32 and exposure (back exposure) 35 to this photoresist by gamma rays (wavelength: 436 nm) for example is executed from the rear side of the glass substrate 30. At this time, a photoresist film 33 with the same width as the gate electrode 31 is formed by self-matching with the gate electrode 31 functioning as a mask. Next, an N$^+$ doped amorphous silicon film 34 including N-type impurities, for example phosphorus (P) is formed on the insulating film 32 and the photoresist film 33 by PECVD for example. The temperature of the substrate at this time shall be the heat-resistant temperature (for example, 150° C.) of the photoresist or less. The thickness of this N$^+$ doped amorphous silicon film 34 is determined according to a drawing showing a characteristic shown in FIG. 8 based upon the thickness of the insulating film 32 as in the first embodiment. That is, as the thickness of the SiO$_2$ layer of the insulating film 32 is set to 100 nm in this embodiment, the required thickness of the amorphous silicon film in an area except the gate electrode 31 is 48 nm as shown in FIG. 8. Therefore, the thickness of the N$^+$ doped amorphous silicon film 34 is set to 18 nm obtained by subtracting 30 nm (the thickness of an amorphous silicon film 36 to be formed continuously) from 48 nm.

Figure 3B:
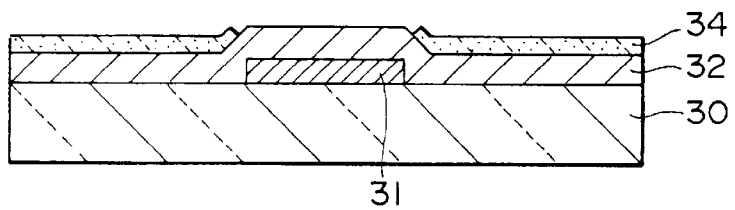

Afterward, as shown in FIG. 3B, the photoresist film 33 and the area of the N$^+$ doped amorphous silicon film 34 on the photoresist film 33 (that is, an area corresponding to a channel area) are selectively removed by a lift-off method.

Figure 3C:
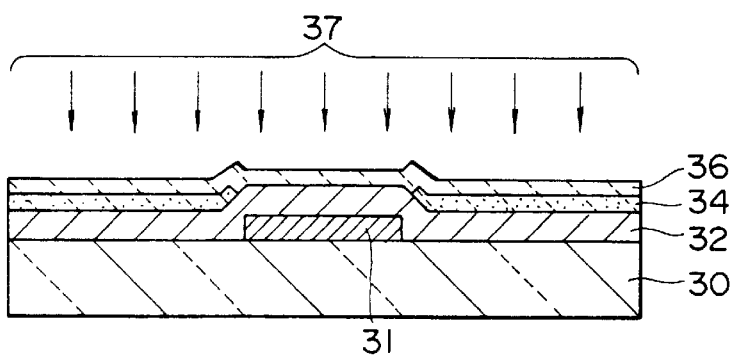

Next, as shown in FIG. 3C, an amorphous silicon film 36 which is 30 nm thick is formed on the N$^+$ doped amorphous silicon film 34 and the insulating film 32 by PECVD for example. Hereby, the amorphous silicon film is thicker in an area (the thickness of the amorphous silicon film: 48 nm) except an area over metal (the gate electrode 31) than in the area (thickness: 30 nm) over metal. In this state, next, a laser beam 37 is radiated on the overall surface from the surface of the substrate. The N$^+$ doped amorphous silicon film 34 and the amorphous silicon film 36 are melted by radiating a laser beam 17 as described above and afterward, melted areas are crystallized by cooling them to room temperature. At this time, the N-type impurities in the N$^+$ doped amorphous silicon film 34 are diffused on the side of the amorphous silicon film 36 and an N$^+$ doped polycrystalline silicon film 38 provided with a source area 38$a$ and a drain area 38$b$ is formed. As in this embodiment, the amorphous silicon film is also thicker in the area (the thickness of the amorphous silicon film: 48 nm) except the area over the metallic film than in the area (thickness: 30 nm) over the metallic film (the gate electrode 31), the maximum temperature of the surface of the film is substantially equal and the overall film can be uniformly crystallized.

Figure 3D:
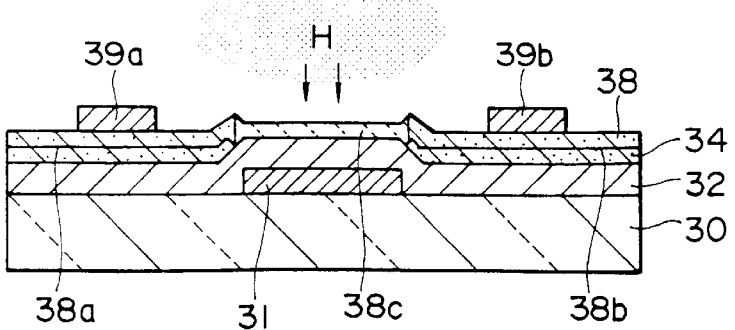

Next, as shown in FIG. 3D, electrodes 39$a$ and 39$b$ consisting of aluminum (Al) are respectively formed on the source area 38$a$ and the drain area 38$b$ in the N$^+$ doped polycrystalline silicon film 38 by sputtering using argon (Ar) as sputtering gas. Next, a channel area 38$c$ in the N$^+$ doped polycrystalline silicon film 38 is hydrogenated in hydrogen plasma to inactivate dangling bond and others.

As described above, according to the method of manufacturing a thin film transistor equivalent to this embodiment, as the thickness of a silicon film is set to a different value depending upon the state of a substrate (whether a metallic film is formed or not) when a laser beam 37 is radiated for crystallization, the silicon film can be uniformly crystallized over the overall substrate and a film can be prevented from being broken.

The embodiments according to the present invention are described above, however, the present invention is not limited to the above embodiments and may be variously transformed. For example, in the above embodiments, a metallic film under a silicon film is a nickel film, however, it may be also formed by the other metallic film. In the above embodiments, a silicon film is used for an amorphous semiconductor film, however, the other amorphous film may be also used if only it can be crystallized by radiating an energy beam. Further, in the above embodiments, the present invention is applied to a method of manufacturing a thin film transistor, however, it may be also applied to a process for manufacturing the other semiconductor device. A method of forming amorphous semiconductor films different in thickness depending upon the structure of a substrate is not limited to the methods described in the above embodiments and the other method may be also used.

As described above, according to the methods of manufacturing a semiconductor device according to the present invention, as the thickness of a semiconductor film is set to a different value depending upon the state of a substrate (whether a metallic film is formed or not) when an energy beam is radiated to crystallize the amorphous semiconductor film, the overall semiconductor film can be uniformly crystallized by radiating beams with the same energy. Therefore, there is effect that a film is never broken and a process margin can be increased.

What is claimed is:

1. A method of manufacturing a semiconductor device, comprising:

a process for selectively forming a metallic film on a substrate;

a process for forming a semiconductor film over said substrate and metallic film; and a process for crystallizing said semiconductor film by radiating an energy beam on said semiconductor film in a state in which said semiconductor film is thicker in an area over said substrate than in an area over said metallic film.

2. A method of manufacturing a semiconductor device according to claim 1, wherein:

said semiconductor film is an amorphous semiconductor film.

3. A method of manufacturing a semiconductor device according to claim 1, wherein:

said semiconductor film is a silicon film.

4. A method of manufacturing a semiconductor device according to claim 1, wherein:

said semiconductor film is an amorphous silicon film.

5. A method of manufacturing a semiconductor device according to claim 1, wherein:

said energy beam is an excimer laser beam.

6. A method of manufacturing a semiconductor device according to claim 1, wherein:

a thickness of said semiconductor film in the area over said substrate and that in the area over said metallic film are selected in said process for crystallizing said semiconductor film by radiating said energy beam so that the maximum temperature in the respective areas of said semiconductor film is substantially equal.

7. A method of manufacturing a semiconductor device according to claim 1, wherein:

a process for forming an insulating film on said substrate and said metallic film is included before said process for forming said semiconductor film and after said process for forming said metallic film.

8. A method of manufacturing a semiconductor device according to claim 7, wherein:

a thickness of said insulating film, that in the area over said substrate of said semiconductor film and that in the area over said metallic film of said semiconductor film are selected in said process for crystallizing said semiconductor film by radiating said energy beam so that the maximum temperature in the respective areas of said semiconductor film is substantially equal.

9. A process of manufacturing a thin film transistor, comprising:

a process for forming a gate electrode in a part on a substrate;

a process for forming an insulating film on said substrate and said gate electrode;

a process for forming a lift-off film in an area corresponding to said gate electrode on said insulating film;

a process for forming a first semiconductor film with a uniform thickness on said lift-off film and said insulating film;

a process for removing said lift-off film and said first semiconductor film on said lift-off film;

a process for forming a second semiconductor film on a residual area of said first semiconductor film and said insulating film;

a process for crystallizing said first and second semiconductor films by radiating an energy beam; and a process for forming source and drain electrodes in a particular position on said first and second semiconductor films.

10. A process of manufacturing a thin film transistor according to claim 9, wherein:

said lift-off film is formed in an area corresponding to said gate electrode by removing part of said lift-off film over areas not corresponding to said gate electrode and exposing a corresponding portion of said first semiconductor film using said gate electrode as a mask.

11. A process of manufacturing a thin film transistor according to claim 9, wherein:

said first semiconductor film includes impurities.

12. A method of manufacturing a semiconductor device, comprising:

a process for selectively forming a metallic film on a substrate;

a process for forming an insulating film on said substrate;

a process for forming a semiconductor film on said insulating film; and a process for crystallizing said semiconductor film by radiating an energy beam on said semiconductor film, wherein:

the thickness of said semiconductor film in an area over said metallic film and that in an area in which said metallic film is not formed are selected so that the maximum temperature in the respective areas when said energy beam is radiated is substantially equal.

* * * * *